United States Patent [19]

Hanks

[11] Patent Number: 4,835,789
[45] Date of Patent: May 30, 1989

[54] ELECTRON-BEAM HEATED EVAPORATION SOURCE

[76] Inventor: Charles W. Hanks, c/o Electron Beam Technology, 3661 Willowick Dr., Ventura, Calif. 93003-1051

[21] Appl. No.: 121,152

[22] Filed: Nov. 16, 1987

[51] Int. Cl.⁴ .......................................... H01J 37/305
[52] U.S. Cl. ..................................................... 373/14
[58] Field of Search ..................... 373/10, 11, 12, 13, 373/14; 430/942

[56] References Cited

U.S. PATENT DOCUMENTS

| | | | |
|---|---|---|---|
| 3,268,648 | 8/1966 | Dietrich | 373/14 |
| 3,303,320 | 2/1967 | Muller | 373/14 |
| 4,064,352 | 12/1977 | Mann | 373/13 |

Primary Examiner—Roy N. Envall, Jr.
Attorney, Agent, or Firm—Julian Caplan

[57] ABSTRACT

A crucible contains a metal to be evaporated by heating from an electron beam source wherein the path of the electrons is controlled by a horizontal transverse magnetic field over the source and crucible. A number of small individual magnets are arranged vertically along opposite sides of the crucible parallel to the beam path. One end of each such magnet is in the closest position possible to deliver its flux lines to the magnetic field area. The magnets maybe permanent or electro- or a combination thereof. By varying the positions of the magnets, the field generated may be controlled in the desired manner.

14 Claims, 2 Drawing Sheets

ELECTRON-BEAM HEATED EVAPORATION SOURCE

BACKGROUND OF THE INVENTION

1. Field of the Invention

This invention relates to a new and improved electron-beam heated source for use in a high vacuum environment to make high grade thin film coatings and the like. More particularly, the invention relates to apparatus employing a water cooled crucible in which the substance which is to be evaporated to make the film coating is placed. An electron-beam gun is positioned on one side of the crucible in such position that the evaporated substance does not damage the gun. In order to direct the path of the electrons emitted from the gun to the crucible, a plurality of magnets is disposed on opposite sides of the crucible to create a transverse magnetic field extending over the top of the gun and the substance to be evaporated. The positioning of such magnets guides and focuses the electrons in a convex path upward and then down into the substance. The magnets may be either permanent or electro- or a combination thereof.

2. Description of Related Art

Prior equipment of this general nature has employed horizontal magnets and utilizes the leakage field around the magnet, guided by pole pieces to provide the required field. Only about one-quarter of the magnetic flux generated by this magnetic arrangement is usefully employed and the rest is lost in leakage flux around the remaining three-quarters of the perimeter of the magnet core not covered by the poles. The present invention is an improvement upon existing art.

SUMMARY OF THE INVENTION

The present invention differs from prior inventions of this general type in that the magnetic force generating means are disposed as close as possible to the area where the magnetic fields are needed, i.e., electron path area. The magnetic forces are used in such a way as to aid in field generation in a manner that minimizes structures that intercept the vapors emitted from the crucible needlessly.

Thus the present invention generates the required horizontal transverse magnetic field over the top of the gun and crucible by the use of a number of markedly smaller individual magnets arranged vertically along the two opposite sides of the crucible parallel to the beam path as contrasted with the magnets previously used. This 90 degree shift in the position of the magnets around the crucible from the usual position places one end of each magnet at the exact closest position possible to deliver its flux lines to the magnetic field area without the use of long poles or shims.

A vertical crucible is placed on a steel plate which constitutes a yoke for the vertically placed magnets connecting the lower ends of the individual magnets which rest thereon on either side of the crucible. One-half of the magnets are positioned on one side of the beam path and the other half are placed on the other side, all in vertical position. In the drawings, for convenience, the magnets on the right side are shown with the north pole at the top and those on the left side with the north pole against the steel base plate.

The foregoing makes for a very efficient magnet system in that essentially one-half of the leakage flux from the magnet tops is attracted to and joins the flux lines of the opposite magnets across the crucible. Leakage flux is minimized in the area of the distance from the top to the bottom of the magnet because that is more than the distance half-way to the opposite pole across the crucible. Accordingly, the apparatus hereinafter described in detail makes possible an efficient magnet system which energizes an evaporation system even more powerful than those in current use.

A comparison with current commercial systems shows that use of the present invention in construction of a unit for the same power consumption and vapor output results in a unit 357 percent smaller in magnet volume and 353 percent smaller in general volume in accordance with the following comparison table:

| | Comparison Table | | | | | | |
|---|---|---|---|---|---|---|---|
| | | Size Inches | | | Volume Cubic Inches | | |
| | Weight | | | | | Mag- | |
| | Pounds | L | W | H | Size | % | nets | % |
| 1 | 14.1 | 6.8 | 4.0 | 2.7 | 77 | 353% | 4.0 | 357% |
| 2 | 10.0 | 6.9 | 4.0 | 2.0 | 57 | 261% | 3.4 | 304% |
| 3 | 4.5 | 3.5 | round | 2.0 | 21.8 | 100% | 1.12 | 100% |

Small physical size of the system is of great importance to those who desire to make multi-element coatings which are non-layered and otherwise homogeneous. Thus one emitter assembly may be used to heat a multiplex of crucibles which may be moved one at a time past the gun. Such items produce layered coatings such as are made in the well known "one-quarter wave stacks" of the optical industry. To obtain greatest uniformity throughout the coating, whether it is a layered coating or a multi-component composite, it is desirable to have the vapor from the sources coming from the same area in space Therefore it is desirable to have sources of small size so that the center-to-center distance between the crucibles may be as small as possible. Evaporation sources may be for use at the same high power as present-day commercial units but, following the embodiments of this invention, present a total volume size which is smaller by a factor of more than 3.

The reduction size of the assembly is accomplished mainly by increasing the efficiency of use of the magnetic system of the electron-beam gun. The only magnetic area needed in an electron-beam system is in the area where the electrons move in space from emitter to target. A fairly large percentage of this flight path is somewhat high above the top of the crucible. U.S. Pat. No. 3,535,428 teaches that the magnetic pole tops may be at crucible level and still have a usable field strength in the electron path. This requires laterally wide poles to help increase the field strength enough that areas somewhat high above the crucible surface have large magnetic means Accordingly, the present invention is considerable improvement thereon.

The use of electro- or permanent magnets in the manner described hereinafter utilizes one of the unique magnetic characteristics of such magnets which does not occur in steel pole systems even though using the same type of magnetic source. In a permanent magnet, all the molecular magnetic domains throughout the bar of material are forced to align in the required direction from the time of initial cooling of the material from the liquid state and particularly through the crystal growing state of the cooling cycle. Upon removal from the mold, the magnet is demagnetized to aid in processing by cutting, grinding, etc. Magnetism can then be restored to the original magnetic state by remagnetizing to the required coercivity.

The presence of firm magnetic material in the ends of permanent magnets and its effect on the lines of force which come out the ends of the magnet is duplicated by the effect of the presence of windings of current-carrying wire at the ends of electro-magnets which force a high percentage of flux lines to go out the end of the core. Merely using steel poles or cores at interfaces where magnetic flux lines come out of high permeability materials into vacuum at low permeability have no such auxiliary field to add a directional effect.

The strongest part of the field on the mid-line of the beam path is about directly on a horizontal line between the top ends of the permanent magnets which are located on opposite sides of the crucible. This results in the beam trajectory being correct without having high poles alongside the crucible. In addition, the crucible walls above the evaporant top may be lower because the magnetic structure, which the cooled crucible walls cover, is lower.

Not only is the vertical magnetic gradient improved in accordance with the present invention, but also the gradient along the beam path is more easily achieved. FIG. 8 of U.S. Pat. No. 3,535,428 discloses the need for fields of different intensity at different parts of the beam path. In previous electron-beam systems for evaporation using transverse fields, it has been necessary to obtain the necessary magnetic gradients by shimming the main poles. This has proved to be an arduous procedure with much machining and filing, testing and fitting. In the present invention it is is easy to move the individual magnets farther apart or closer together and then lock them in position.

Conventional electron beam heated vapor sources generate a spray of electrons knocked out of and off of the evaporant surface atoms as well as some of the primaries that are elastically scattered off the surface. These come out in widely divergent directions from the surface. However the paths of all of them are changed by the magnetic field lines to paths that are bent and focused in the same direction as the initial beam. This directs some of them onto the back end of the source but some go on out into the vacuum chamber and end up heating chamber components, usually undesirably. The energy of the errant electrons can be as high as 10% of the initial beam power. Most manufacturers of extant electron beam evaporation sources add a copper barrier connected to the rearmost water-cooled surface.

In accordance with the instant modular magnet system, additional vertical permanent magnets may be added at the rear to generate a vertically high field of high intensity without disturbing the main beam-handling field. The electrons coming towards the extreme rear of the course are bent down into the water-cooled structure at the rear of the crucible.

The use of multiple sets of magnets makes it easy to set up different degrees of magnetic intensity along the beam path However, small pole pieces may be used to allow a more gradual change in magnetic intensity or an extension of the magnetic field into areas where it is not convenient to install another magnetic structure. In general, the magnets for this use operate best without poles.

One of the objects of this invention is to provide an improved high-vacuum vapor source assembly for use in conventional vacuum coating deposition equipment.

Another object of the invention is to provide a vapor source of very small size without reducing either the normal volume of evaporant or reducing heating power capability.

A further object of the invention is to provide an efficient small-vapor source using magnetic mechanisms which provide the most efficient use of the magnetic field quantity by sharply reducing the path lengths of the magnetic field lines by installing the magnetic generating devices as near to the electron-beam path area as possible.

Still another object of the invention is to provide a small volume of object-wise vacuum deposition source which makes efficient use of the magnetic generating means by arranging the positions of the magnets along the extent of the electron path from emitter to past the point of impact of the beam with the material being evaporated.

Other objects of the present invention will become apparant upon reading the following specification and referring to the accompanying drawings in which similar characters of reference represent corresponding parts in each of the several views.

IN THE DRAWINGS

DESCRIPTION OF PREFERRED EMBODIMENTS

Figure 2:
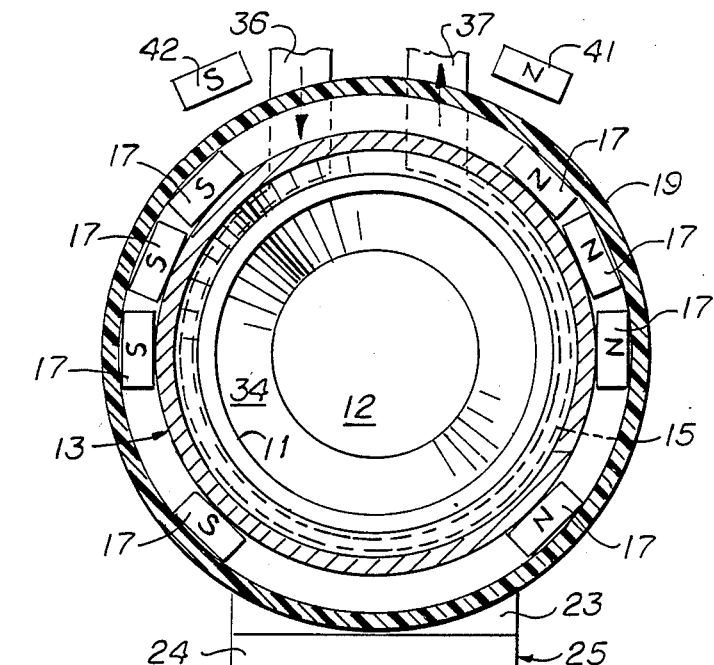
FIG. 2 is a somewhat schematic horizontal sectional view taken substantially along the line 2—2 of FIG. 1.

Hollow 11 is formed in crucible block 13 and receives evaporant 12. The block 13 is preferably of copper and has formed on the outside thereof a water passage groove 14. Copper sleeve 15 is placed around the outside of the crucible 13, thereby forming a closed passage 14. As best shown in FIG. 2, inlet conduit 36 and outlet conduit 37 communicate with the water passage 14 to supply water or other coolant to cool the crucible 13.

Figure 1:
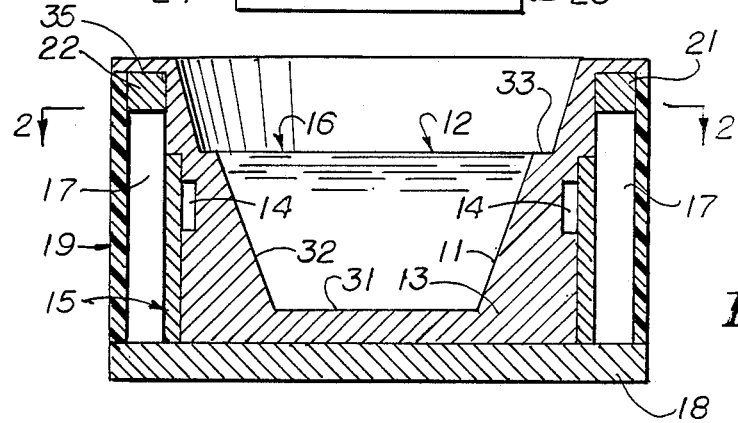
FIG. 1 is a transverse vertical mid-section through a crucible and associated elements in accordance with the present invention.

Skull 16, the general position of which is indicated by reference numeral 16 in FIG. 1, forms at the side of the molten pool of evaporant 12 and prevents deleterious interchange between the material which is being evaporated and the copper crucible.

In a preferred form of the crucible best shown in FIG. 1, a bottom 31 is formed extending horizontally near the lower edge of the block 13 and upward-outward slanted sides 32 extend to a horizontal ledge 33. The level of evaporant 12 is at or below the ledge 33. Above ledge 33 the walls of the block slant upward-outward as shown by reference numeral 34 and there is a horizontal shelf 35 extending around the perimeter of the hollow 11.

Shown in the accompanying drawings are individual permanent rectangular cross-section bar magnets 17 located with their lower ends resting on a steel baseplate 18 which fits below the bottom of the crucible 13. On the exterior of the magnets 17 is an outside cover 19. Steel poles 21, 22 may be positioned on top of the magnets 17 although in the preferred embodiment of the invention these poles are eliminated. The number and positioning of the magnets is illustrated in FIG. 2 and is subject to some variation. Thus, on the righthand side of FIG. 2 there are four magnets 17 with the north poles upward and the south poles resting upon baseplate 18, whereas on the lefthand side there are four similar magnets with their south poles uppermost. The number and position of the magnets 17 is subject to variation, the end result of their positioning being to guide and focus the electrons on their convex path upward and then downward into the evaporant 12.

Directing attention to FIG. 2, the electron-beam gun 25 is shown schematically as having an anode 23 and a filament-type emitter 24 positioned at or above the level of the top of the crucible 13 and to one side thereof.

It will be understood that variations in the positioning and construction of the source of electrons is subject to considerable variation.

Figure 3:
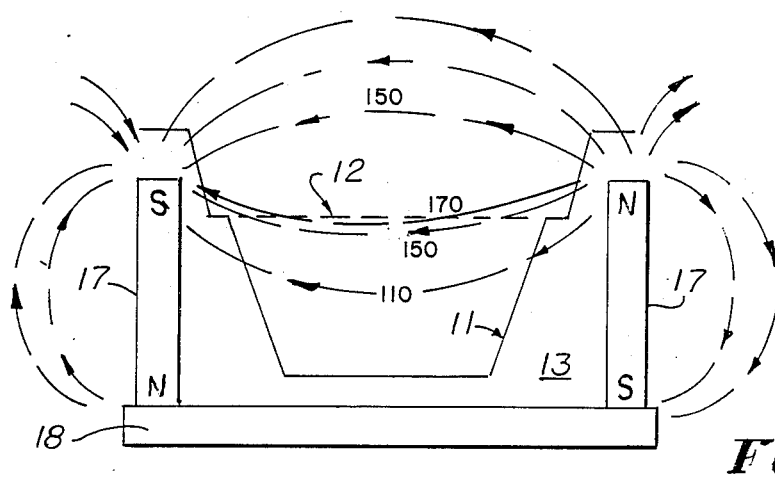
FIG. 3 is a schematic view showing lines of magnetic force in accordance with the present invention.

FIG. 3 shows schematically the magnetic lines of force emitted from magnets 17 on opposite sides of crucible 13, and marked on FIG. 3 are numerals indicating gauss.

The foregoing described structure produces the results hereinabove set forth.

Optionally, two magnets 41 and 42 may be placed just rearward of magnets 17 and 29. Being placed closer together than the main beam-handling magnets, they generate such a high field that even full primary voltage electrons cannot get by at any normal medium-high path direction. Hence electrons coming toward the extreme rear of the source are bent down into the water-cooled structure at the rear of crucible 13.

Figure 4:
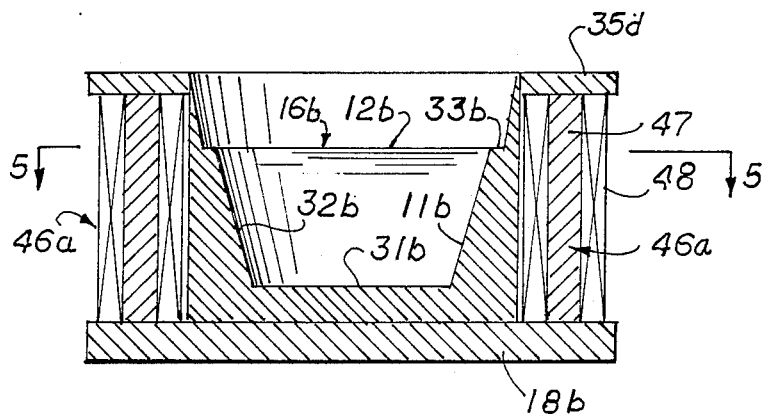
FIG. 4 is a view similar to FIG. 1 of a modification.
Figure 5:
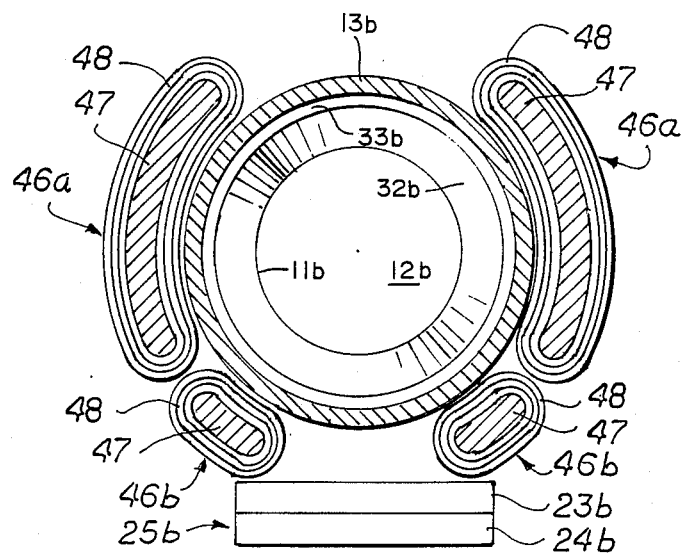
FIG. 5 is a sectional view taken substantially along line 5—5 of FIG. 4.

FIGS. 4 and 5 illustrate use of opposed pairs of electromagnets 46a, b, each having a core 47 and coils 48 connection to a DC source (not shown).

Figure 6:
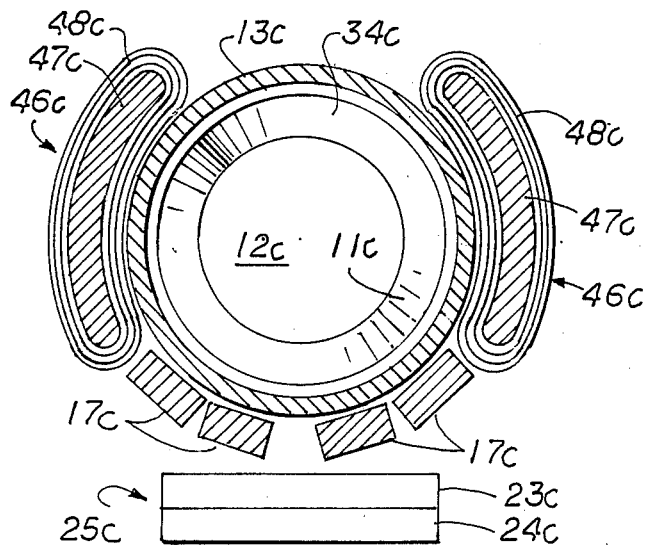
FIG. 6 is a view similar to FIG. 5 of a further modification.

FIG. 6 shows a DC electromagnet 46c and a permanent magnet 17c in combination.

In other respects the modifications of FIGS. 4, and 6 are substantially the same as FIGS. 1–4 and the same reference numerals followed by subscripts b and c, respectively, are used to designate corresponding parts.

What is claimed is:

1. An evaporation source apparatus comprising a crucible containing said source, an electron beam source displaced from said crucible, and means for directing electrons in a path from said electron source to said crucible comprising a first plurality of discrete magnets of a first polarity positioned spaced apart from each other on a first side of said crucible and on a first side of said path and a second plurality of discrete magnets of a second polarity opposite said first polarity positioned space apart from each other on a second side of said crucible and a second side of said path opposite said first side, all said magnets being on the same side of said electron beam source as said crucible.

2. Apparatus according to claim 1 in which the number of said first plurality of magnets equals said second plurality of magnets.

3. Apparatus according to claim 2 in which said magnets are positioned with each of said first plurality of magents directly opposite a corresponding magnet of said second plurality of magnets.

4. Apparatus according to claim 1 in which said magnets are permanent magnets.

5. Apparatus according to claim 4 which further comprises a magnetiziable baseplate under said crucible, said magnets resting on said baseplate.

6. Apparatus according to claim 4 in which said magnets extend from above the level of evaporation source in said crucible to a level below said evaporative source.

7. Apparatus according to claim 4 which further comprises pole positions on the upper ends of said magnets.

8. Apparatus according to claim 1 in which said magnets ar electro-magnets.

9. Apparatus according to claim 1 in which said magnets are a combination of permanent and electro-magnets.

10. Apparatus according to claim 1 which further comprises a cover extending around the outside of said magnets.

11. An evaporation source apparatus comprising a crucible containing said source, as electron beam source displaced from said crucible, and means for directing electrons in a path from said electron source to said crucible comprising a first plurality of discrete magnets of a first polarity positioned spaced apart from each other on a first side of said crucible and on a first side of said path and a second plurality of discrete magnets of a second polarity opposite said first polarity positioned spaced apart from each other on a second side of said crucible and a second side of said path opposite said first side, all said magnets being approximately equidistant form the center of said crucible.

12. Apparatus according to claim 1 which further comprises a first polarity additional magnet positioned on a first side of said path rearward of said first plurality of magnets and a second polarity additional magnet positioned on a second side of said plate rearward of said second plurality of magnets.

13. Apparatus according to claim 12 in which said first and second additional magnets are closer together than are any other of said magnets of opposite polarity.

14. An evaporation source apparatus comprising a crucible containing said source, an electron beam source displaced from said crucible, and means for directing electrons in a path from said electron source to said crucible comprising a first plurality of discrete magnets of a first polarity positioned spaced apart form each other on a first side of said crucible and on a first side of said path and a second plurality of discrete magnets of a second polarity opposite said first polarity positioned spaced apart from each there on a second side of said crucible and a second side of said path opposite said first side, said discrete magnets being the sole force for directing electrons in said path.

* * * * *